(12) United States Patent
Patrick et al.

(10) Patent No.: US 7,228,257 B1
(45) Date of Patent: Jun. 5, 2007

(54) ARCHITECTURE FOR GENERAL PURPOSE PROGRAMMABLE SEMICONDUCTOR PROCESSING SYSTEM AND METHODS THEREFOR

(75) Inventors: Roger Patrick, Mountain View, CA (US); Vincent Wong, Pleasanton, CA (US); Chung Ho Huang, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 378 days.

(21) Appl. No.: 10/460,879

(22) Filed: Jun. 13, 2003

(51) Int. Cl.
G06F 19/00 (2006.01)

(52) U.S. Cl. .................. 702/189; 702/31; 702/108; 702/117; 702/119; 700/121; 382/144; 382/145; 382/147

(58) Field of Classification Search .............. 702/108, 702/117, 119, 31, 189; 700/121; 382/144, 382/145, 147
See application file for complete search history.

(56) References Cited

U.S. PATENT DOCUMENTS

| | | | | |
|---|---|---|---|---|
| 6,312,525 | B1* | 11/2001 | Bright et al. ............... | 118/719 |
| 6,425,116 | B1* | 7/2002 | Duboc et al. ................ | 716/18 |
| 6,486,116 | B1* | 11/2002 | Hinton ....................... | 510/441 |
| 6,782,331 | B2* | 8/2004 | Ayadi ......................... | 702/68 |
| 6,868,513 | B1* | 3/2005 | Botala et al. ............... | 714/738 |
| 6,959,225 | B1* | 10/2005 | Logsdon et al. ............ | 700/100 |
| 2002/0144212 | A1* | 10/2002 | Lev et al. ................... | 716/1 |
| 2005/0047645 | A1* | 3/2005 | Funk et al. ................. | 382/145 |
| 2005/0187649 | A1* | 8/2005 | Funk et al. ................. | 700/121 |

OTHER PUBLICATIONS

U.S. Appl. No. 60/414,425.*
PCT Int'l Search Report mailed Jun. 12, 2006 re PCT/US04/16414.
PCT Written Opinion mailed Jun. 12, 2006 re PCT/US04/16414.
PCT Int'l Preliminary Report on Patentability, International Application No. PCT/US2004/016414, Issued Jul. 27, 2006, pp. 1-2.

* cited by examiner

Primary Examiner—Carol S. W. Tsai
(74) Attorney, Agent, or Firm—IP Strategy Group, P.C.

(57) ABSTRACT

A method of optimizing a set of steps in a semi-conductor processing system comprising a software control program, wherein the semi-conductor processing system includes a first function, a second function, and a third function, and further includes a memory for storing a set of variables, and wherein the set of steps further includes a first step, a second step, and a third step. The invention includes generating the first step on an editor application, wherein the first function is added to the first step, and if required, a first set of user input instructions is added. The invention also includes generating the second step on the editor application, wherein the second function is added to the second step, and if required, a second set of user input instructions is added; and generating the third step on the editor application, wherein the third function is added to the third step, and if required, a third set of user input instructions is added. The invention further includes placing the first step, the second step, and the third step in a proper order; transferring the set of steps to the semi-conductor processing system; executing the set of steps; storing a set of results in the set of variables; and, if required, generating a report from the set of variables.

24 Claims, 18 Drawing Sheets

```
1    step1: (
2        command: #setOnline
3        parameters: (
4            title: 'PM Offline'
5            description: 'Process chamber state offline to prevent waferflow into the PM after this macro
6    step. This ensures that users do not inadvertently process unintended wafers during the macro sequence.'
7            online: false
8            continueIfFailed: true
9            startRequired: false
10       )
11   )
12   step2: (
13       command: #ioRequest
14       parameters: (
15           title: 'System Info'
16           description: 'Records the current values stored in the software AI parameters on the
17   PM/Diagnose/System Information UI subpage. This information provides a snapshot of the tool state.'
18           ioPoints: (
19               ioPoint1: 'WaferSize'
20               ioPoint2: 'CurrentWaferCount'
21               ioPoint3: 'TotalWaferCount'
22               ioPoint4: 'TCPRFCurrentRFOnTime'
23               ioPoint5: 'TCPRFTotalRFOnTime'
24               ioPoint6: 'TCPRFTotalRFOnInHours'
25               ioPoint7: 'BiasRFCurrentRFOnTime'
26               ioPoint8: 'BiasRFTotalRFOnTime'
27               ioPoint9: 'BiasRFTotalRFOnInHours'
28               ioPoint10: 'ProcessManometerZeroOffset'
29               ioPoint11: 'ElapsedRFTimeToClean'
30               ioPoint12: 'ElapsedWaferCountToClean'
31               ioPoint13: 'mode'
32           )
33           continueIfFailed: true
34           startRequired: false
35       )
36   )
37   step3: (
38       command: #userInput
39       parameters: (
40           title: 'Daily User Input'
41           description: 'This is the start of the Daily Process Module Qual macro sequence. The purpose
42   is to monitor key tool performance data and alert users when the tool has drifted out of control.'
43           requiredStep: '10'
44           steps: (
45               step1: (
46                   description: 'Enter User Name'
47                   helpText: 'Required Input in the comments column user full name for
48   identification and tracking purposes.'
49               )
50               step2: (
51                   description: 'Enter the purpose for this test currently'
52                   helpText: 'Input in the comments column a brief description of any relevant
53   hardware/process related information for this Process Module.'
54               )
55           )
56           continueIfFailed: true
```

FIG. 2A (Partial View 1 of 7 of FIGs 2A – 2G)

```
57                    startRequired: false
58          )
59      )
60  step4: (
61          command: #ioCheck
62          parameters: (
63                  title: 'Chamber Temp Check'
64                  description: 'Checks the current values stored in the software AI parameters on the
65  PM/Diagnose/IO/System Heater Channels UI subpage and other temperature related software parameters vs.
66  their recommended setpoints.'
67                  ioPoints: (
68                          ioPoint1: (
69                                  name: 'BiasElectrodeHousingTemperatureMonitor_AI'
70                                  value: 60
71                                  tolerance:5
72                          )
73                          ioPoint2: (
74                                  name: 'ChamberFrontLeftTemperatureMonitor_AI'
75                                  value: 60
76                                  tolerance:5
77                          )
78                          ioPoint3: (
79                                  name: 'ChamberFrontRightTemperatureMonitor_AI'
80                                  value: 60
81                                  tolerance:5
82                          )
83                          ioPoint4: (
84                                  name: 'ChamberRearLeftTemperatureMonitor_AI'
85                                  value: 60
86                                  tolerance:5
87                          )
88                          ioPoint5: (
89                                  name: 'ChamberRearRightTemperatureMonitor_AI'
90                                  value: 60
91                                  tolerance:5
92                          )
93                          ioPoint6: (
94                                  name: 'GasRingTemperatureMonitor_AI'
95                                  value: 60
96                                  tolerance:5
97                          )
98                          ioPoint7: (
99                                  name: 'ThrottleValveTemperatureMonitor_AI'
100                                 value: 60
101                                 tolerance:5
102                         )
103                         ioPoint8: (
104                                 name: 'InnerESCTemperature_AI'
105                                 value: 60
106                                 tolerance:5
107                         )
108                         ioPoint9: (
109                                 name: 'TCUMonitor_AI'
110                                 value: 20
111                                 tolerance:5
112                         )
```

FIG. 2B (Partial View 2 of 7 of FIGs 2A – 2G)

```
113                     ioPoint10: (
114                             name: 'OuterESCTemperature_AI'
115                             value: 60
116                             tolerance:5
117                     )
118             )
119             continueIfFailed: false
120             startRequired: false
121     )
122 )
123 step5: (
124     command: #pumpDown
125     parameters: (
126
127             title: 'Chamber Pumpdown (0.5mT/5min/3x)'
128             description: 'This macro executes a chamber pumpdown. The (0.5mT/5min/3x) notation
129 refers to a check for base pressure of 0.5mT, if this condition is not met there will be a 2 minute delay prior to
130 retry, with a total of 3 pumpdown attempts.'
131             limit: 0.5
132             delaytime: 5
133             retry: 3
134             continueIfFailed: true
135             startRequired: false
136     )
137 )
138 step6: (
139     command: #idle
140     parameters: (
141             title: 'Chamber idle'
142             description: 'Chamber is pumped down idle for 5 minutes.'
143             time: 5
144             continueIfFailed: true
145             startRequired: false
146     )
147 )
148 step7: (
149     command: #ioRequest
150     parameters: (
151             title: 'Pressure Information'
152             description: 'Records the current values stored in the software AI parameters on the
153 PM/Diagnose/IO/Manometer Raw Reading UI subpage and other pressure related software parameters.'
154             ioPoints: (
155                     ioPoint1: 'ProcessManometer_AI'
156                     ioPoint2: 'ProcessManometerZeroOffset'
157                     ioPoint3: 'ProcessManometerAdjustedPressure'
158                     ioPoint4: 'ProcessManometer_RawAI'
159                     ioPoint5: 'ChamberPressureManometer_AI'
160                     ioPoint6: 'ChamberManometer_RawAI'
161                     ioPoint7: 'ForelinePressureManometer_AI'
162                     ioPoint8: 'ChamberManometerReadingInTorr'
163                     ioPoint9: 'ChamberManometerZeroOffset'
164                     ioPoint10: 'ChamberManometerAdjustedPressure'
165             )
166             continueIfFailed: true
167             startRequired: false
168     )
```

FIG. 2C (Partial View 3 of 7 of FIGs 2A – 2G)

```
169     )
170     step8: (
171             command: #leakback
172             parameters: (
173                     title: 'Chamber Leakrate (1mT/5min/3x)'
174                     description: 'Executes a chamber leakrate check. The (1mT/5min/3x) notation refers to a
175     check for leakrate of 1mT/min, if this condition is not met there will be a 5 minute delay prior to retry, with a
176     total of 3 leakrate attempts.'
177                     limit: 1
178                     delaytime: 5
179                     retry: 3
180                     continueIfFailed: true
181                     startRequired: false
182             )
183     )
184     step9: (
185             command: #pumpDown
186             parameters: (
187                     title: 'Chamber Pumpdown (0.5mT/5min/3x)'
188                     description: 'This macro executes a chamber pumpdown. The (0.5mT/5min/3x) notation
189     refers to a check for base pressure of 0.5mT, if this condition is not met there will be a 2 minute delay prior to
190     retry, with a total of 3 pumpdown attempts.'
191                     limit: 0.5
192                     delaytime: 5
193                     retry: 3
194                     continueIfFailed: true
195                     startRequired: false
196             )
197     )
198     step10: (
199             command: #vciProbe
200             parameters: (
201                     title: 'VCI No-Plasma V-Probe'
202                     description: 'This macro executes the VCI No-Plasma V-Probe test with spec checking.'
203                     NumberSamples: 40
204                     NumberSetpoints: 20
205                     SampleInterval: 125
206                     setpt: (
207                             setpt1: 5
208                             setpt2: 10
209                             setpt3: 15
210                             setpt4: 20
211                             setpt5: 25
212                             setpt6: 30
213                             setpt7: 35
214                             setpt8: 40
215                             setpt9: 45
216                             setpt10: 50
217                             setpt11: 55
218                             setpt12: 60
219                             setpt13: 65
220                             setpt14: 70
221                             setpt15: 75
222                             setpt16: 80
223                             setpt17: 0
224                             setpt18: 0
```

FIG. 2D (Partial View 4 of 7 of FIGs 2A – 2G)

```
225                         setpt19: 0
226                         setpt20: 0
227                     )
228                     StabilizeTime: 5
229                     continueIfFailed: true
230                     startRequired: false
231                     effectiveResistance: 0.385
232                     eRTolerance: 57
233                     rSquare: 0.999
234             )
235     )
236     step11: (
237             command: #pumpDown
238             parameters: (
239                     title: 'Chamber Pumpdown (0.5mT/5min/3x)'
240                     description: 'This macro executes a chamber pumpdown. The (0.5mT/5min/3x) notation
241 refers to a check for base pressure of 0.5mT, if this condition is not met there will be a 2 minute delay prior to
242 retry, with a total of 3 pumpdown attempts.'
243                     limit: 0.5
244                     delaytime: 5
245                     retry: 3
246                     continueIfFailed: true
247                     startRequired: false
248             )
249     )
250     step12: (
251             command: #onePointGasCal
252             parameters: (
253                     title: 'Gas Cal One Point 100%'
254                     description: 'This macro executes the one point gas calibration for process gases at 100% of
255 MFC full scale. Each gas setpoint is compared to actual flow with spec checking.'
256                     gaslineArray: '000000000001'
257                     setpt: (
258                             setpt1: 100
259                             setpt2: 100
260                             setpt3: 100
261                             setpt4: 100
262                             setpt5: 100
263                             setpt6: 100
264                             setpt7: 100
265                             setpt8: 100
266                             setpt9: 100
267                             setpt10: 100
268                             setpt11: 100
269                             setpt12: 100
270                     )
271                     toleranceList:(
272                             Gas1:5
273                             Gas2:5
274                             Gas3:5
275                             Gas4:2
276                             Gas5:5
277                             Gas6:5
278                             Gas7:5
279                             Gas8:5
280                             Gas9:5
```

FIG. 2E (Partial View 5 of 7 of FIGs 2A – 2G)

```
281                         Gas10:5
282                         Gas11:5
283                         Gas12:5
284                     )
285                     continueIfFailed: true
286                     startRequired: false
287             )
288     )
289     step13: (
290             command: #onePointGasCal
291             parameters: (
292                     title: 'Gas Cal One Point 30%'
293                     description: 'This macro executes the one point gas calibration for process gases at 30% of
294     MFC full scale. Each gas setpoint is compared to actual flow with spec checking.'
295                     gaslineArray: '111111111111'
296                     setpt: (
297                             setpt1: 30
298                             setpt2: 30
299                             setpt3: 30
300                             setpt4: 30
301                             setpt5: 30
302                             setpt6: 30
303                             setpt7: 30
304                             setpt8: 30
305                             setpt9: 30
306                             setpt10: 30
307                             setpt11: 30
308                             setpt12: 30
309                     )
310                     toleranceList:(
311                             Gas1:5
312                             Gas2:5
313                             Gas3:5
314                             Gas4:2
315                             Gas5:5
316                             Gas6:5
317                             Gas7:5
318                             Gas8:5
319                             Gas9:5
320                             Gas10:5
321                             Gas11:5
322                             Gas12:5
323                     )
324                     continueIfFailed: true
325                     startRequired: false
326             )
327     )
328     step14: (
329             command: #onePointGasCal
330             parameters: (
331                     title: 'Gas Cal One Point at 10%'
332                     description: 'This macro executes the one point gas calibration for process gases at 10% of
333     MFC full scale. Each gas setpoint is compared to actual flow with spec checking.'
334                     gaslineArray: '000100000001'
335                     setpt: (
336                             setpt1: 10
```

FIG. 2F (Partial View 6 of 7 of FIGs 2A – 2G)

```
337             setpt2: 10
338             setpt3: 10
339             setpt4: 10
340             setpt5: 10
341             setpt6: 10
342             setpt7: 10
343             setpt8: 10
344             setpt9: 10
345             setpt10: 10
346             setpt11: 10
347             setpt12: 10
348         )
349         toleranceList:(
350             Gas1:5
351             Gas2:5
352             Gas3:5
353             Gas4:2
354             Gas5:5
355             Gas6:5
356             Gas7:5
357             Gas8:5
358             Gas9:5
359             Gas10:5
360             Gas11:5
361             Gas12:5
362         )
363         continueIfFailed: true
364         startRequired: false
365     )
366 )
367 step15: (
368     command: #setOnline
369     parameters: (
370         title: 'PM Online'
371         description: 'Process chamber state online to allow waferflow into the PM after this macro
372 step. This ensures that users can routinely process wafers after the completion of the macro sequence.'
373         online: true
374         continueIfFailed: true
375         startRequired: false
376     )
377 )
```

FIG. 2G (Partial View 7 of 7 of FIGs 2A – 2G)

Tool ID: Generic
Chamber ID: PM2
Macro Report:

Macro Result Summary:
Macro Completed Successfully
Macro time elapsed:0 day 1 hour 17 minute 12 second.

| Step No. | Step Description | Type | Status |
|---|---|---|---|
| 1 | PM Offline | Auto | Passed |
| 2 | System Info | Auto | Passed |
| 3 | Daily User Input | Man | Passed |
| 4 | Chamber Temp Check | Auto | Failed |
| 5 | Chamber Pumpdown (0.5mT/5min/3x) | Auto | Passed |
| 6 | Chamber Idle | Auto | Passed |
| 7 | Pressure Information | Auto | Passed |
| 8 | Chamber Leakrate (1mT/5min/3x) | Auto | Passed |
| 9 | Chamber Pumpdown (0.5mT/5min/3x) | Auto | Passed |
| 10 | VCI No-Plasma V-Probe | Auto | Passed |
| 11 | Chamber Pumpdown (0.5mT/5min/3x) | Auto | Passed |
| 12 | Gas Cal One Point 70% | Auto | Passed |
| 13 | Chamber Pumpdown (0.5mT/5min/3x) | Auto | Passed |
| 14 | Gas Cal One Point Various | Auto | Failed |
| 15 | PM Online | Auto | Passed |

Macro Step1: PM Offline

| | |
|---|---|
| Command: Take PM Offline | |
| Status: Passed | |
| Timestamp: 4/17/2003 6:28:4 | |

Macro Step2: System Info

| | |
|---|---|
| Command: IO Point Request | |
| Status: Passed | |
| Timestamp: 4/17/2003 6:28:4 | |
| IO Points Data: | |

| IO Points | Value |
|---|---|
| BiasRFCurrentRFOnTime | 12139.9 |
| BiasRFTotalRFOnInHours | 202.332 |
| BiasRFTotalRFOnTime | 12139.9 |
| CurrentWaferCount | 11049 |
| ElapsedRFTimeToClean | 0 |
| ElapsedWaferCountToClean | 0 |
| mode | Maintenance |
| ProcessManometerZeroOffset | -0.146484 |
| TCPRFCurrentRFOnTime | 20770.4 |
| TCPRFTotalRFOnInHours | 346.174 |
| TCPRFTotalRFOnTime | 20770.4 |
| TotalWaferCount | 11049 |
| WaferSize | 200MM |

FIG. 3A (Partial View of 1 of 5 FIGs. 3A-3E)

Macro Step3: Daily User Input

| Command: Intervention Required Command |
|---|
| Step1:Enter User Name |
| Comments:RR |
| Status: Completed |
| Completion Time:4/17/2003 6:28:6 |
| Step2:Enter the purpose for this test currently |
| Comments: |
| Status: Completed |
| Completion Time:4/17/2003 6:28:10 |
| Status: Passed |

Macro Step4: Chamber Temp Check

| Command: IO Point Check | | | | |
|---|---|---|---|---|
| Status: Passed | | | | |
| Timestamp: 4/17/2003 6:28:10 | | | | |
| IO Points Data: | | | | |
| IO Points | Value | Spec Value | Percent Error | Spec Tolerance |
| BiasElectrodeHousingTemperatureMonitor_AI | 60.1 | 60 | 0% | 5% |
| ChamberFrontLeftTemperatureMonitor_AI | 60.1 | 60 | 0% | 5% |
| ChamberFrontRightTemperatureMonitor_AI | 60.1 | 60 | 0% | 5% |
| ChamberRearLeftTemperatureMonitor_AI | 60.1 | 60 | 0% | 5% |
| ChamberRearRightTemperatureMonitor_AI | 60.1 | 60 | 0% | 5% |
| GasRingTemperatureMonitor_AI | 60.2 | 60 | 0% | 5% |
| InnerESCTemperature_AI | 59.5062 | 60 | 1% | 5% |
| OuterESCTemperature_AI | 60.0624 | 60 | 0% | 5% |
| TCUMonitor_AI | 19 | 20 | 5% | 5% |
| ThrottleValveTemperatureMonitor_AI | 60.1 | 60 | 0% | 5% |

Macro Step5: Chamber Pumpdown (0.5mT/5min/3x)

| Command: Pump Down |
|---|
| Status: Passed |
| Timestamp: 4/17/2003 6:28:12 |
| Chamber Pressure: 0.292969 |

Macro Step6: Chamber Idle

| Command: Idle Delay |
|---|
| Status: Passed |
| Timestamp: 4/17/2003 6:33:12 |

FIG. 3B (Partial View of 2 of 5 of FIGs. 3A-3E)

Macro Step7: Pressure Information

| Command: IO Point Request | |
|---|---|
| Status: Passed | |
| Timestamp: 4/17/2003 6:33:12 | |
| IO Points Data: | |
| IO Points | Value |
| ChamberManometerAdjustedPressure | 0 |
| ChamberManometerReadingInTorr | 0.0292969 |
| ChamberManometerZeroOffset | -29.2969 |
| ChamberManometer_RawAI | 29.2969 |
| ChamberPressureManometer_AI | 29.2969 |
| ForelinePressureManometer_AI | 29.2969 |
| ProcessManometerAdjustedPressure | 0.292969 |
| ProcessManometerZeroOffset | -0.146484 |
| ProcessManometer_AI | 0.439453 |
| ProcessManometer_RawAI | 43.9453 |

Macro Step8: Chamber Leakrate (1mT/5min/3x)

| Command: Leakback |
|---|
| Status: Passed |
| Timestamp: 4/17/2003 6:36:46 |
| Leakrate: 0.301339 |

Macro Step9: Chamber Pumpdown (0.5mT/5min/3x)

| Command: Pump Down |
|---|
| Status: Passed |
| Timestamp: 4/17/2003 6:37:16 |
| Chamber Pressure: 0.292969 |

FIG. 3C (Partial View of 3 of 5 of FIGs. 3A-3E)

Macro Step10: VCI No-Plasma V-Probe

| Command: VCIProbe |
|---|
| Status: Passed |
| Number Samples: 40 |
| Number Setpoints: 20 |
| Sample Interval: 125 |
| Stabilize Time: 5 |
| Timestamp: 4/17/2003 6:40:10 |
| Capacitance: 320 |
| Slope: 4541.11 |
| R Squared: 0.99998 |
| Effective Resistance: 0.593536 |
| Effective Resistance Tolerance: 57% |

| Setpoint: | VProbe | VProbeSq | Forward | Reflected |
|---|---|---|---|---|
| 5 | 148.682 | 22106.2 | 4.89844 | 1.92969 |
| 10 | 213.398 | 45538.9 | 10.0937 | 3.97813 |
| 15 | 262.632 | 68975.5 | 15.0664 | 6.21953 |
| 20 | 303.94 | 92379.8 | 20.1875 | 7.67422 |
| 25 | 338.35 | 114480 | 25.2047 | 7.27344 |
| 30 | 368.672 | 135919 | 30.2219 | 0 |
| 35 | 396.548 | 157250 | 34.868 | 0 |
| 40 | 424.922 | 180559 | 39.7813 | 0 |
| 45 | 451.084 | 203477 | 44.9766 | 0 |
| 50 | 475.723 | 226312 | 49.875 | 0 |
| 55 | 499.468 | 249468 | 55.1594 | 0 |
| 60 | 521.587 | 272053 | 59.9094 | 0 |
| 65 | 542.183 | 293962 | 64.7187 | 0 |
| 70 | 562.808 | 316752 | 69.825 | 0 |
| 75 | 583.242 | 340171 | 74.8125 | 0 |
| 80 | 602.812 | 363383 | 79.8742 | 0 |
| 0 | 0 | 0 | 0 | 0 |
| 0 | 0 | 0 | 0 | 0 |
| 0 | 0 | 0 | 0 | 0 |
| 0 | 0 | 0 | 0 | 0 |

Macro Step11: Chamber Pumpdown (0.5mT/5min/3x)

| Command: Pump Down |
|---|
| Status: Passed |
| Timestamp: 4/17/2003 6:40:40 |
| Chamber Pressure: 0.292969 |

FIG. 3D (Partial View of 4 of 5 of FIGs. 3A-3E)

Macro Step12: Gas Cal One Point 70%

| Command: One Point Gas Calibration | | | | | | |
|---|---|---|---|---|---|---|
| Status: Failed | | | | | | |
| Error Text: One Point Gas Calibration Failed. Calibration out of error tolerance. | | | | | | |
| Gas Line: Gas1 | | | | | | |
| Gas Name: Cl2-200 | | | | | | |
| TimeStamp: 4/17/200306:45:23 | | | | | | |
| Tolerance Spec: 5% | | | | | | |
| Result: Within Tolerance | | | | | | |
| Req Flow | Actual Flow | R Squared | Cal Point | Inv Volume | Delta | % Error |
| 136.5 | 133.572 | 0.999948 | 178 | 95657.2 | 2.9279 | 2.14498 |
| Gas Line: Gas2 | | | | | | |
| Gas Name: HBr-500 | | | | | | |
| TimeStamp: 4/17/200306:49:40 | | | | | | |
| Tolerance Spec: 5% | | | | | | |
| Result: Within Tolerance | | | | | | |
| Req Flow | Actual Flow | R Squared | Cal Point | Inv Volume | Delta | % Error |
| 350 | 339.984 | 0.99997 | 141 | 96363 | 10.016 | 2.86171 |
| Gas Line: Gas3 | | | | | | |
| Gas Name: CF4-200 | | | | | | |
| TimeStamp: 4/17/200306:54:32 | | | | | | |
| Tolerance Spec: 5% | | | | | | |
| Result: Within Tolerance | | | | | | |
| Req Flow | Actual Flow | R Squared | Cal Point | Inv Volume | Delta | % Error |
| 140 | 135.935 | 0.999957 | 178 | 96404.9 | 4.06541 | 2.90387 |
| Gas Line: Gas4 | | | | | | |
| Gas Name: O2-20 | | | | | | |
| TimeStamp: 4/17/200306:59:15 | | | | | | |
| Tolerance Spec: 2% | | | | | | |
| Result: Out of Tolerance | | | | | | |
| Req Flow | Actual Flow | R Squared | Cal Point | Inv Volume | Delta | % Error |
| 14 | 13.7176 | 0.996471 | 177 | 95532.6 | 0.282428 | 2.01734 |
| Gas Line: Gas5 | | | | | | |
| Gas Name: O2-200 | | | | | | |
| TimeStamp: 4/17/200307:04:04 | | | | | | |
| Tolerance Spec: 5% | | | | | | |
| Result: Within Tolerance | | | | | | |
| Req Flow | Actual Flow | R Squared | Cal Point | Inv Volume | Delta | % Error |
| 140 | 137.088 | 0.999958 | 178 | 95593.5 | 2.91156 | 2.07969 |
| Gas Line: Gas6 | | | | | | |
| Gas Name: He-500 | | | | | | |
| TimeStamp: 4/17/200307:08:09 | | | | | | |
| Tolerance Spec: 5% | | | | | | |
| Result: Within Tolerance | | | | | | |
| Req Flow | Actual Flow | R Squared | Cal Point | Inv Volume | Delta | % Error |
| 350 | 340.355 | 0.999969 | 141 | 96258 | 9.64511 | 2.75575 |
| Gas Line: Gas7 | | | | | | |
| Gas Name: SF6-200 | | | | | | |
| TimeStamp: 4/17/200307:13:00 | | | | | | |
| Tolerance Spec: 5% | | | | | | |
| Result: Within Tolerance | | | | | | |
| Req Flow | Actual Flow | R Squared | Cal Point | Inv Volume | Delta | % Error |
| 140 | 136.284 | 0.999954 | 177 | 96158 | 3.71646 | 2.65461 |

FIG. 3E (Partial View of 5 of 5 of FIGs. 3A-3E)

ARCHITECTURE FOR GENERAL PURPOSE PROGRAMMABLE SEMICONDUCTOR PROCESSING SYSTEM AND METHODS THEREFOR

BACKGROUND OF THE INVENTION

The present invention relates in general to semi-conductor manufacturing technologies and in particular to methods and apparatus of optimizing a set of operations in a semi-conductor capital equipment processing system.

Semi-conductor fabrication facilities often cost billions of dollars to design and operate. Optimizing throughput and decreasing costs are therefore critical for profitability. Capital equipment processing systems within these facilities, however, often require significant human manual intervention creating the potential for process variances or even outright operation mistakes.

Most semi-conductor capital equipment processing systems are normally controlled by sophisticated computers comprising operating software programs, wherein users via a interface are provided the ability to send requests to the equipment and receive output information from the equipment. These procedure steps for the most part are executed manually. In a typical operating environment, the user manually configures parameters for the manufacturing process (e.g., voltage, gas flow mix, gas flow rate, pressure, etc.) and then manually initiates start execution. The processing system examines its state by either evaluating signals from one or more sensing devices (e.g., position encoders, temperature and pressure sensors, flow rate indicators, etc.) or by requesting that the operator input information (e.g. the results of spectra optical emission, gas proportion mix, etc.). Test product is initially run through the system, to insure that the process is within acceptable parameters, after which the production run is started. During this process, the operator is usually expected to follow printed procedures and physically write down system measurements at appropriate time.

However, because of differences in training, experience, or attitude, different operators can implement the same test differently on the same machine. Furthermore, information entered in the process data notebooks may be incomplete or incorrect, presenting problems for process engineers who are tasked to insure that the fabrication process is optimally configured and manufacturing yields are maintained at an acceptable level.

Process variance is further compounded when multiple versions of the same processing system are concurrently used in the manufacture of the same product. Since an otherwise identical piece of fabrication equipment may be installed at a different time, or is used to a different degree, its maintenance cycle does not necessarily match that of the others, potentially causing chamber-to-chamber process variation.

Furthermore, there is often a need to safely and quickly modify the operation of a processing system at the customer site. In general, changes in semi-conductor fabrication equipment procedures are often difficult to implement, especially in the case of multiple equipment units. This lack of process flexibility can create substantial inefficiency and hence significantly increase production costs. For example, a customer may want the processing equipment to perform a new testing procedure because of some newly discovered process variance. In order to implement this new procedure, the vendor must first create or modify an existing written procedure and send a field engineer to the customer site to perform training, then monitor for changes in tool performance for a period of time to insure proper functionality. This process can take several weeks, potentially costing several hundreds of thousands of dollars.

In view of the foregoing, there is desired an architecture for a general purpose programmable semi-conductor processing system.

SUMMARY OF THE INVENTION

The invention relates, in one embodiment, to a method of optimizing a set of steps in a semi-conductor processing system comprising a software control program, wherein the semi-conductor processing system includes a first function, a second function, and a third function, and further includes a memory for storing a set of variables, and wherein the set of steps further includes a first step, a second step, and a third step. The invention includes generating the first step on an editor application, wherein the first function is added to the first step, and if required, a first set of user input instructions is added. The invention also includes generating the second step on the editor application, wherein the second function is added to the second step, and if required, a second set of user input instructions is added; and generating the third step on the editor application, wherein the third function is added to the third step, and if required, a third set of user input instructions is added. The invention further includes placing the first step, the second step, and the third step in a proper order; transferring the set of steps to the semi-conductor processing system; executing the set of steps; storing a set of results in the set of variables; and, if required, generating a report from the set of variables.

The invention relates, in another embodiment, to an apparatus for optimizing a set of steps in a semi-conductor processing system comprising a software control program, wherein the semi-conductor processing system includes a first function, a second function, and a third function, and further includes a memory for storing a set of variables, and wherein the set of steps further includes a first step, a second step, and a third step. The invention includes a means of generating the first step on a editor application, wherein the first function is added to the first step, and if required, a first set of user input instructions is added. The invention also includes a means of generating the second step on the editor application, wherein the second function is added to the second step, and if required, a second set of user input instructions is added; and a means of generating the third step on the editor application, wherein the third function is added to the third step, and if required, a third set of user input instructions is added. The invention further includes a means of placing the first step, the second step, and the third step in a proper order; a means of transferring the set of steps to the semi-conductor processing system; a means of executing the set of steps; a means of storing a set of results in the set of variables; and, if required, a means of generating a report from the set of variables. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A-2G depict a simplified set of macros for controlling a semi-conductor processing system, according to one embodiment of the invention;

FIG. 3A-3E depict a simplified report of the results of the simplified set of macros for controlling a semi-conductor processing system, according to one embodiment of the invention;

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one embodiment of the present invention, a macro engine is advantageously employed to extend and enhance the capabilities of a semi-conductor processing system. That is, a set of control instructions or steps, called a macro, can be created to control the functions of the semi-conductor processing system and to further store process information in the memory in order to generate a report. Furthermore, these instructions can be created and modified with a macro editor, and subsequently stored in a file.

In one embodiment, the set of macros comprise a manufacturing procedure that was previously programmed in a non-macro fashion, such as hardware startup qualification. In another embodiment, the set of macros comprise manufacturing procedures that were previously physically printed. In yet another embodiment, the set of macros allows the user to enter system measurements directly into the semi-conductor processing system. In yet another embodiment, the set of macros substantially monitors operator actions and subsequently creates a log of semi-conductor processing system events, actions, errors, and problems. In yet another embodiment, this log can be electronically retrieved and remotely analyzed. In another embodiment, a user interface is employed to allow the operator to interact with the set of macros. In another embodiment, the semi-conductor processing system can be fully automated, and run without user interaction. In another embodiment, the set of macros can be standardized on all substantially equivalent semi-conductor procession systems, substantially reducing chamber-to-chamber performance variations. In still another embodiment, the set of macros can be executed from a remote host. In another embodiment, the set of macros can be obfuscated or encrypted.

Figure 1:
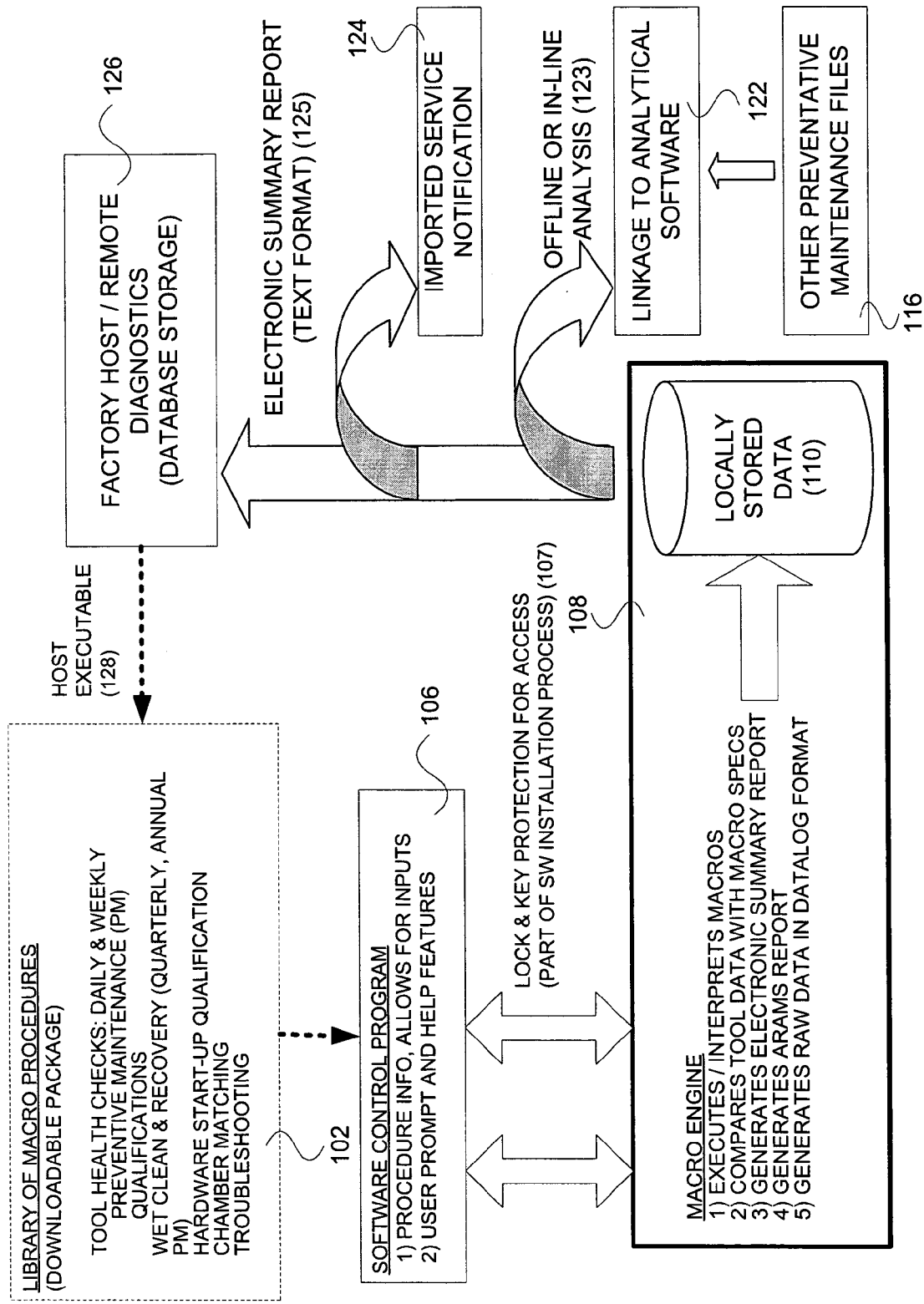
FIG. 1 depicts a simplified diagram of a process for creating macros, according to one embodiment of the invention.

Referring now to FIG. 1, a simplified diagram of a process for creating macros is shown, according to one embodiment of the invention. Initially, a library of macro procedures 102 is created for use in a semi-conductor processing system. For example, in a plasma processing system, this library can consist of tool health checks such as daily and weekly preventative maintenance (PM) qualifications, wet clean and recovery, hardware start-up qualification, chamber matching, and troubleshooting.

This library may then be uploaded to the software control program 106 of a semi-conductor processing system. In one embodiment, the semi-conductor processing system comprises a macro engine 108 that interprets macro procedures. In another embodiment, the semi-conductor processing system comprises a macro engine 108 that executes macro procedures. Each of these macro procedures can then be performed in proper sequence by macro engine 108. During operation, the semi-conductor processing system, in turn, examines its state and compares the result to established specifications, or requests that the operator input information. Macro engine 108 may further compare tool data with macro specifications, and may generate and locally store 110 an electronic summary report, a tool performance tracking report, and/or raw data in datalog format. In one embodiment, each report may be in a web-based output format, such as XML or HTML.

Furthermore, these reports and raw data can be collected from multiple semi-conductor processing systems and subsequently analyzed by offline or online analytical software. This information may also be imported into a service notification 124 that may automatically send an alert to the appropriate person, should a problem arise. In addition, each semi-conductor processing system's electronic summary report 125 may be aggregated in a factory hosted and may be remotely accessed with remote diagnostics 126. Through a host executable program 128, this information may be re-incorporated into the creation and modification of macro procedure library 102.

Referring now to FIG. 2, a set of macros is shown for controlling a semi-conductor processing system. Although in this example, the set of macros is executing within a Lam software macro engine, the present invention can be applied to other types of semi-conductor processing equipment and software. This macro, entitled dailycheck, is composed of multiple steps that may be executed in sequential order. Furthermore, each step can further require the operator to begin its execution (as shown at line 9 "startRequired: false"), and to continue on to the next step in the case of the previous step's failure (as shown at line 8 "continueIfFailed: true").

The first step (as shown on lines 1-11) processes the chamber state offline in order to prevent waferflow into the PM after this macro step. This ensures that users do not inadvertently process unintended wafers during the macro sequence. The second step (as shown on lines 12-36), records the current values stored in the software AI parameters on the PM/Diagnose/System Information user interface window. This information provides a snapshot of the tool state. The third step (as shown on lines 37-59) monitors key tool performance data and alert users when the tool has drifted out of control. It is the start of the Daily Process Module Qual macro sequence.

The fourth step (as shown on lines 60-122) checks the current values stored in the software AI parameters on the PM/Diagnose/IO/System Heater Channels user interface window and other temperature related software parameters vs. their recommended setpoints. The fifth step (as shown on lines 123-137) executes a chamber pumpdown. The sixth step (as shown on lines 138-147) idles the chamber. The seventh step (as shown on lines 148-169) records the current values stored in the software AI parameters on the PM/Diagnose/IO/Manometer Raw Reading user interface window and other pressure related software parameters. The eighth step (as shown on lines 170-183) executes a chamber leakrate check. The ninth step (as shown on lines 184-197) executes a chamber pumpdown. The tenth step (as shown on lines 198-235) executes the VCI No-Plasma V-Probe test with spec checking.

The eleventh step (as shown on lines 236-249) executes a chamber pumpdown. The twelfth step (as shown on lines 250-288) executes the one point gas calibration for process gases at 100% of MFC full scale. The thirteenth step (as shown on lines 289-327) executes the one point gas calibration for process gases at 30% of MFC full scale. The fourteenth step (as shown on lines 328-366) executes the one point gas calibration for process gases at 10% of MFC full scale. And finally, the fifteenth step (as shown on lines 367-377) processes chamber state online to allow waferflow into the PM after this macro step. This ensures that users can routinely process wafers after the completion of the macro sequence.

Referring now to FIG. 3, a simplified report is shown of the results of the set of macros for controlling a semi-conductor processing system, as described in FIG. 2, according to one embodiment of the invention. Each macro step in FIG. 2 may have a corresponding report section in FIG. 3. Initially, a status summary of all the steps is shown. For example, step 4 (Chamber Temp Check) and step 14 (Gas Cal One Point Various) have failed, while the remaining steps have passed. In one embodiment, this report is generated in a spreadsheet format, such as Microsoft Excel.

Figure 4:
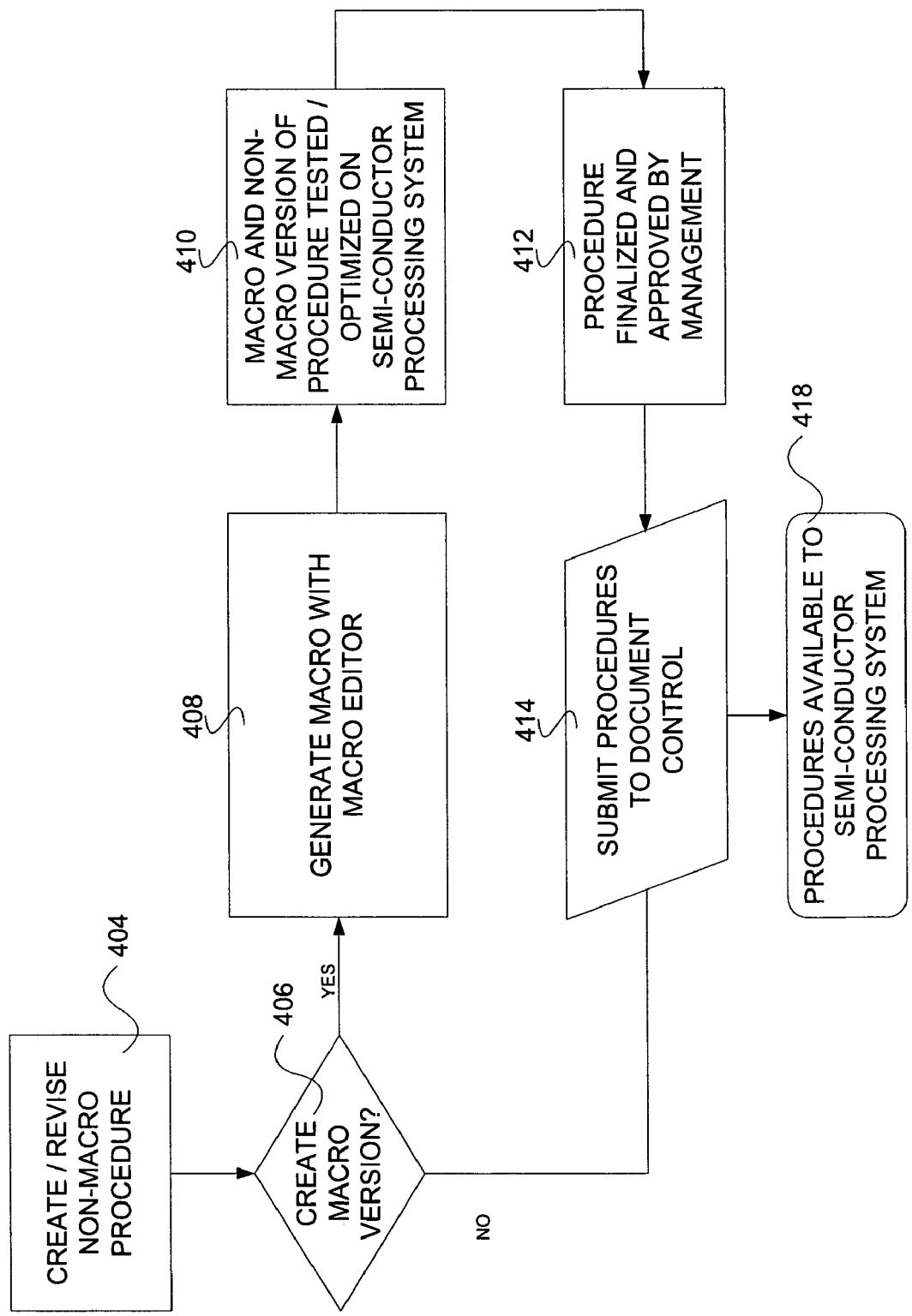
FIG. 4 depicts a simplified flowchart showing the steps for creating a macro for controlling a semi-conductor processing system, according to one embodiment of the invention; and, FIGS. 5A-B depict a graphical display for a semi-conductor processing system, according to one embodiment of the invention

Referring now to FIG. 4, a simplified flowchart showing the steps for creating a macro for controlling a semi-conductor processing system is shown. Initially, a non-macro procedure is created or revised at step 402. If a macro version of the procedure is desired at step 406, the macro is generated with the macro editor at step 408. At this point, both the macro and non-macro procedures are tested and optimized on the semi-conductor processing system, at step 410. The procedure is then finalized and approved by management at step 412. The both the macro and non-macro procedures may then be submitted to a document control system at step 414, after which they would be available for use on the semi-conductor processing system at step 418.

Figure 5A:
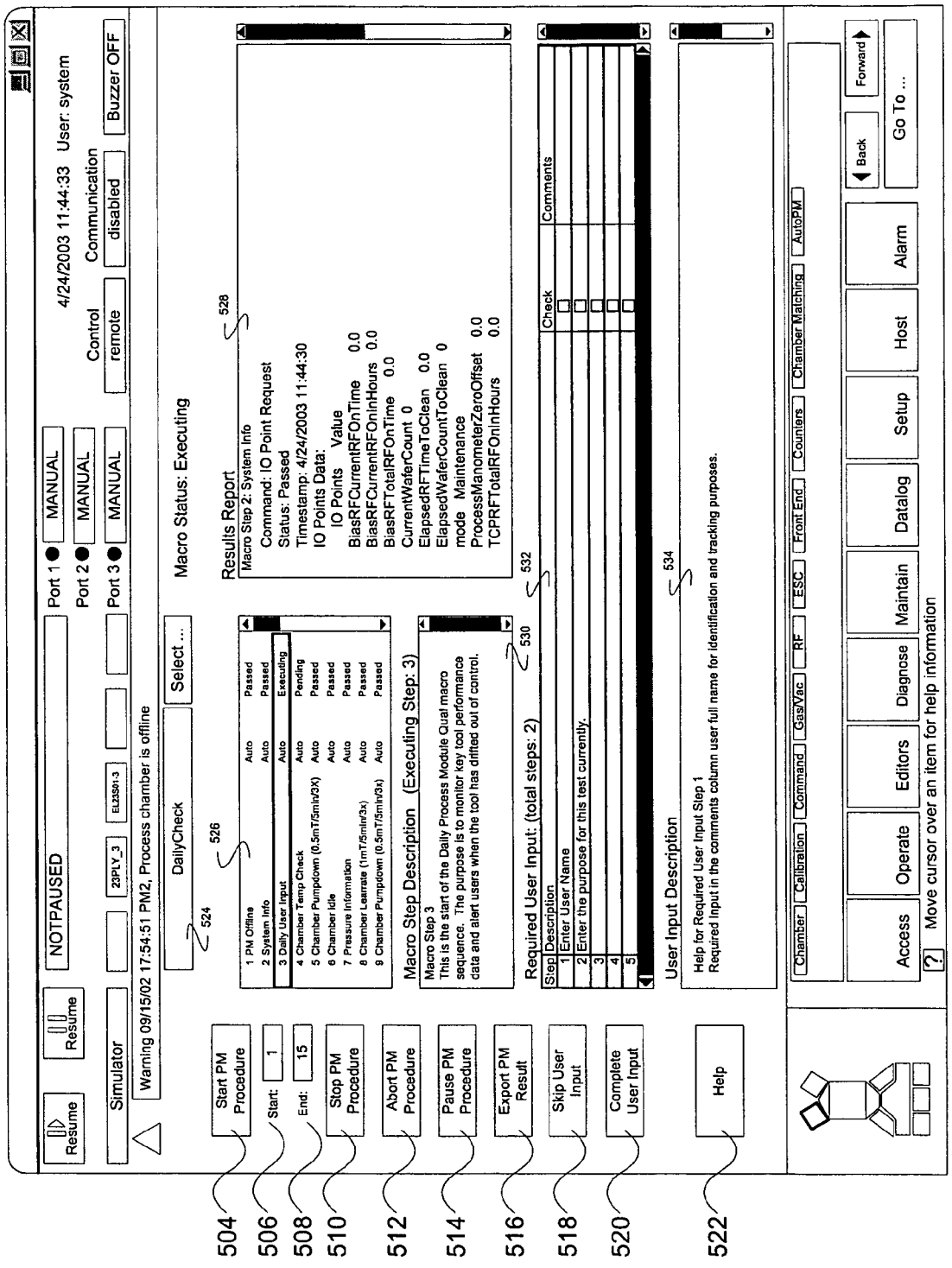
Figure 5B:
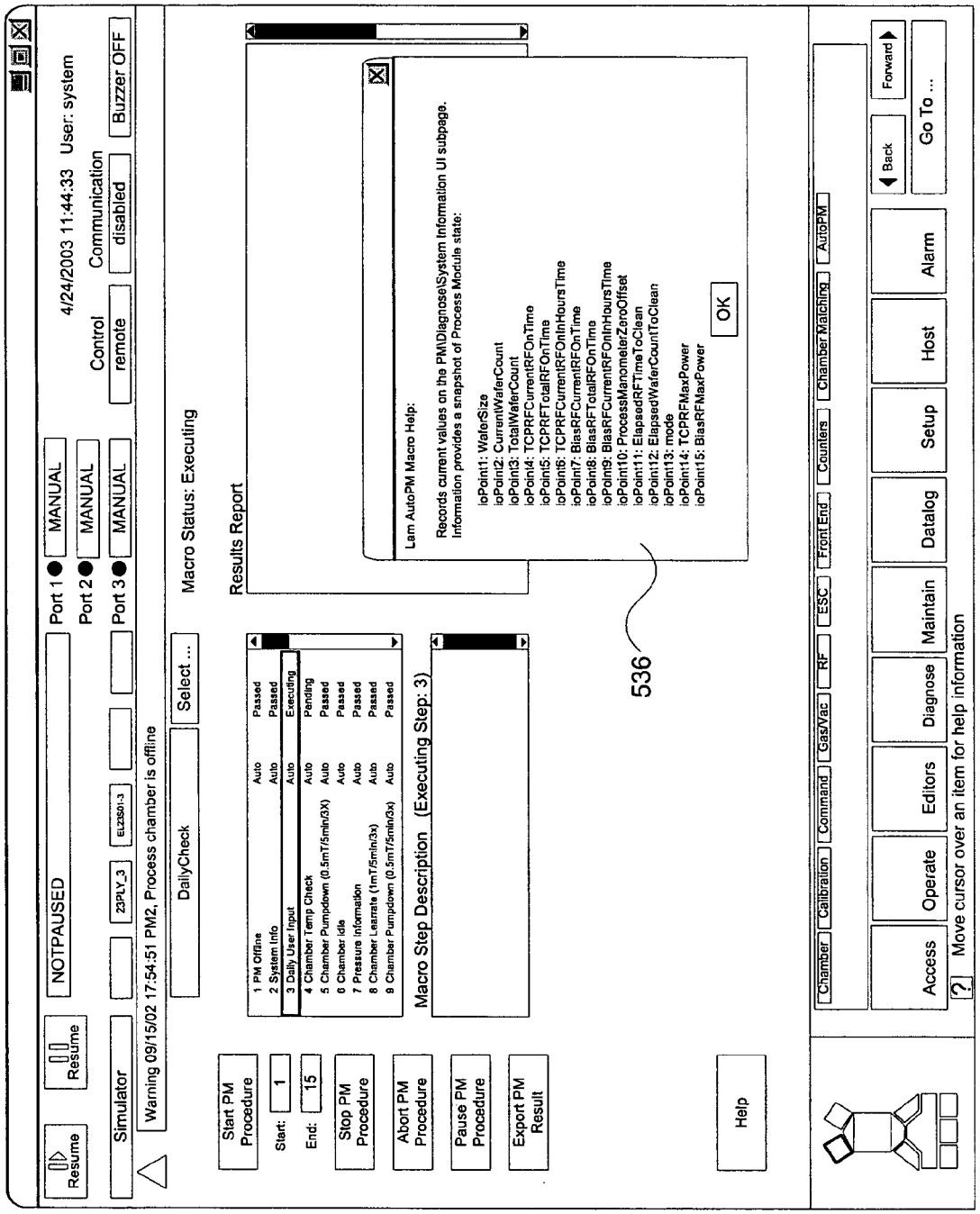

Referring now to FIGS. 5A-B, a graphical display for a semi-conductor processing system is shown, according to one embodiment of the invention. Although in this example, the set of macros is executing within a Lam software macro engine, the present invention can be applied to other types of semi-conductor processing equipment and software. Referring now to FIG. 5A, the display window may be visually divided into several sections. Display box 524 shows the selected macro procedure, in this case the dailycheck procedure as shown in FIG. 2.

A set of buttons 504-522, allow the user to control the execution of macros within the semi-conductor processing system, here a plasma processing chamber. Button 504 allows the user to start the macro comprising steps, as shown in display window 526, and corresponding to the set of macros shown in FIG. 2. Display window 506 and 508 show that first and last steps within the macro that will be executing within macro engine. Button 510 allows the user to stop the macro procedure, button 512 allows the user to abort the macro procedure, and button 514 allows the user to temporarily pause the macro procedure. Where user input is optional, button 518 allows the user to skip user input, as shown in display box 532. Button 520 signals to macro engine that the user has completed user input. Button 522 allows the user to launch a help window, to further explain the current procedure. Display box 530 displays information describing the macro to the user. Display box 534 displays information describing the required user input shown in display box 532. Display box 528 shows the simplified report described in FIG. 3. Referring now to FIG. 5B, the display window of FIG. 5A is shown, with a macro engine help window 536.

Figure 6A:
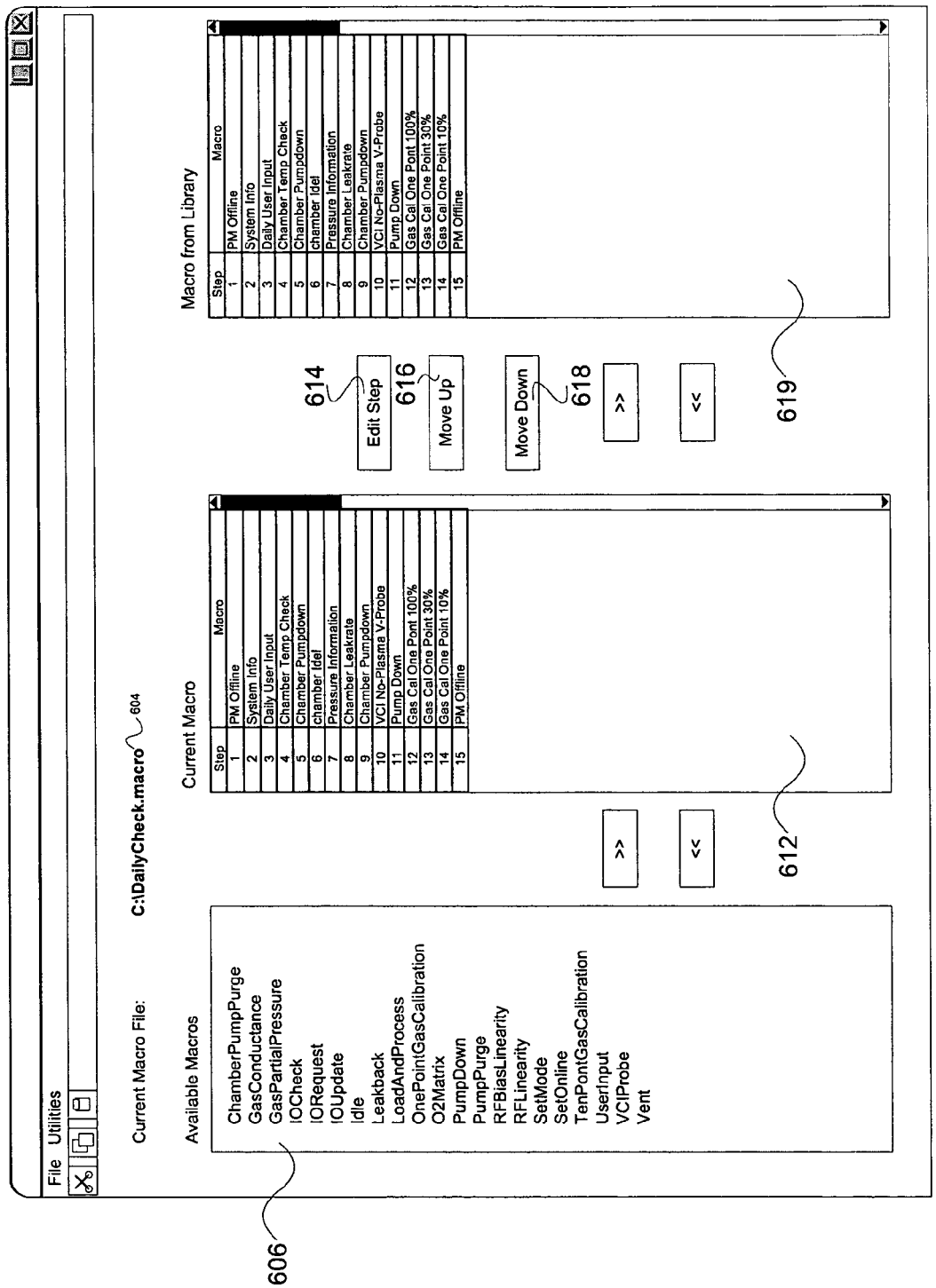
FIGS. 6A-B depict a macro editor for a semi-conductor processing system, according to one embodiment of the invention.
Figure 6B:
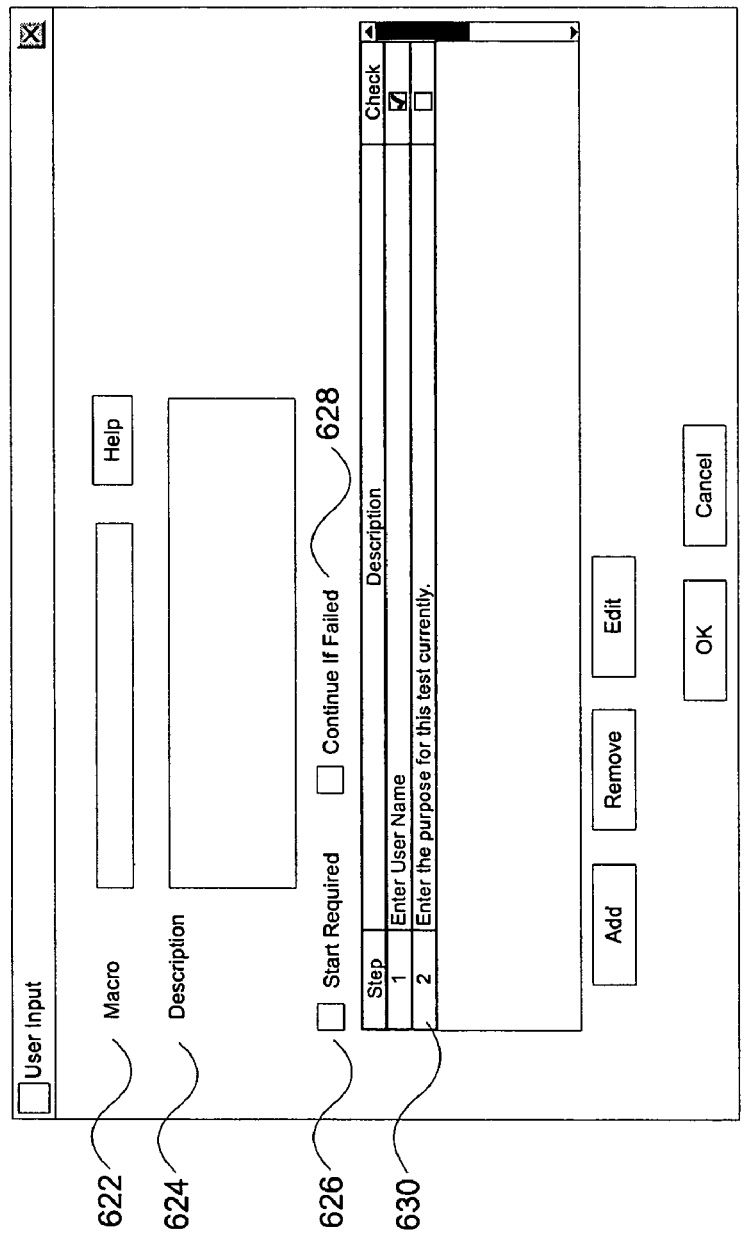

Referring now to FIGS. 6A-B, the macro editor is shown, according to one embodiment of the invention. Although in this example, the macro editor is associated with the Lam software macro engine, the present invention can be applied to other types of semi-conductor processing equipment and software. Generally, a semi-conductor processing system engineer will use a macro editor to create the macro procedure, as shown in FIG. 4. Referring now to FIG. 6A, display box 606 shows the list of available macros for the specific semi-conductor processing system that may be used to construct the dailycheck macro. Furthermore, portions of existing customized macros, as shown in display box 619, may also be ported into the dailycheck macro. Since macros generally execute in sequential order, the engineer can alter an element within the macro procedure by moving it up, at button 616, or down at button 618. Display box 612 displays the simplified report that will be generated after the dailycheck procedure is executed. The engineer can further edit or add a macro at button 614.

Referring now to FIG. 6B, a user input window of the macro editor, as shown in FIG. 6A is shown, according to one embodiment of the invention. The selected macro name in entered in display box 622, and a corresponding description is added to display box 624. If the user is required to start the macro, check box 626 is checked. If the test is allowed to continue should a failure occur, check box 628 is selected. The individual steps required for use input are entered in display area 630.

While this invention has been described in terms of several preferred embodiments, there are alterations, permutations, and equivalents which fall within the scope of this invention. For example, although the drawings are described in the context of plasma processing, it should be understood that the invention also applies to other portions of semi-conductor manufacturing, such as photolithography, direct wafer stepping, die attach, etc. Furthermore, the term semi-conductor processing system is used in its generic sense, and can be understood to comprise equipment within the fabrication facility, directly involved in the production of semi-conductors or glass panels, and which are further capable of storing a control program as a set of macros. It is therefore intended that the following appended claims be interpreted as including all such alterations, permutations, and equivalents as fall within the true spirit and scope of the present invention.

Advantages of the invention include the optimization of user interaction with semi-conductor processing equipment. Other advantages included potentially reducing process variance between substantially similar semi-conductor processing systems, and further optimizing semi-conductor processing equipment configuration flexibility.

Having disclosed exemplary embodiments and the best mode, modifications and variations may be made to the disclosed embodiments while remaining within the subject and spirit of the invention as defined by the following claims.

What is claimed is:

1. A method of automating a set of off-line tasks in a semi-conductor processing system, comprising:
   creating, using an editor application, a macro comprising a set of steps, said set of steps pertaining to said set of off-line tasks to be performed prior to processing substrates in said semi-conductor processing system;
   providing said macro to a macro execution engine in said semi-conductor processing system;
   executing said macro at said semi-conductor processing system, using said macro execution engine, thereby performing said set of steps; and
   generating a report having therein data values collected during said executing.

2. The method of claim 1, wherein said set of steps are executed on said semi-conductor processing system.

3. The method of claim 2, wherein said set of steps are executed by an automatic timer.

4. The method of claim 1, wherein said semi-conductor processing system is a plasma processing system.

5. The method of claim 1, wherein said report is electronically retrieved from said semi-conductor processing system.

6. The method of claim 1, wherein said report is in a spreadsheet format.

7. The method of claim 1, wherein said report is in a text format.

8. The method of claim 1, wherein said report is in a datalog format.

9. The method of claim 1, wherein said report is in a binary format.

10. The method of claim 1, wherein said set of steps are transferred to said semi-conductor processing system during the manufacture of said semi-conductor processing system.

11. The method of claim 1, wherein said set of steps are transferred to said semi-conductor processing system after said semi-conductor processing system has been installed at a semi-conductor fabrication facility.

12. The method of claim 1, wherein said set of steps is obfuscated.

13. The method of claim 1, wherein said set of steps is encrypted.

14. The method of claim 1, where said macro can only be accessed with a password.

15. The method of claim 1, wherein one of said set of steps requires a user input.

16. The method of claim 1, wherein in one of said set of steps, a checklist is presented to a user for manual execution.

17. The method of claim 1, wherein said macro is executed from a remote host.

18. A method of automating a set of off-line tasks in a plurality of semi-conductor processing systems, comprising:
   creating, using an editor application, a macro comprising a set of steps, said set of steps pertaining to said set of off-line tasks that are performed prior to processing substrates in said plurality of semi-conductor processing systems;
   providing said macro to macro execution engines in said plurality of semi-conductor processing systems;
   executing said macro at said plurality of semi-conductor processing systems, using said macro execution engines, thereby performing said set of steps;
   generating reports having therein data values collected during said executing at each of said plurality of semi-conductor processing systems; and
   providing said reports to a remote facility for analysis.

19. The method of claim 18 further comprising generating an alert based on said reports.

20. The method of claim 18 wherein said semi-conductor processing system is a plasma processing system.

21. The method of claim 18, wherein said set of steps are transferred to said plurality of semi-conductor processing systems during the manufacture of said plurality of semi-conductor processing systems.

22. The method of claim 18, wherein said set of steps are transferred to one of said plurality of semi-conductor processing systems after said one of said plurality of semi-conductor processing systems has been installed at a semi-conductor fabrication facility.

23. The method of claim 18, wherein said set of steps is obfuscated.

24. The method of claim 18, wherein said set of steps is encrypted.

* * * * *